US007525463B2

United States Patent
Saunders et al.

(10) Patent No.: US 7,525,463 B2
(45) Date of Patent: Apr. 28, 2009

(54) COMPRESSION RATE CONTROL SYSTEM AND METHOD WITH VARIABLE SUBBAND PROCESSING

(75) Inventors: Steven E. Saunders, Cupertino, CA (US); William C. Lynch, Palo Alto, CA (US); Krasimir D. Kolarov, Menlo Park, CA (US)

(73) Assignee: Droplet Technology, Inc., Menlo Park, CA (US)

( * ) Notice: Subject to any disclaimer, the term of this patent is extended or adjusted under 35 U.S.C. 154(b) by 0 days.

(21) Appl. No.: 11/232,165

(22) Filed: Sep. 20, 2005

(65) Prior Publication Data

US 2006/0071826 A1 Apr. 6, 2006

Related U.S. Application Data

(63) Continuation-in-part of application No. 10/955,240, filed on Sep. 29, 2004, and a continuation-in-part of application No. 10/944,437, filed on Sep. 16, 2004, and a continuation-in-part of application No. 10/447,455, filed on May 28, 2003, and a continuation-in-part of application No. 10/447,514, filed on May 28, 2003, and a continuation-in-part of application No. 10/418,649, filed on Apr. 17, 2003, and a continuation-in-part of application No. 10/418,363, filed on Apr. 17, 2003.

(60) Provisional application No. 60/654,058, filed on Feb. 16, 2005, provisional application No. 60/618,938, filed on Oct. 13, 2004, provisional application No. 60/618,558, filed on Oct. 12, 2004, provisional application No. 60/612,652, filed on Sep. 22, 2004, provisional application No. 60/612,651, filed on Sep. 22, 2004, provisional application No. 60/612,311, filed on Sep. 21, 2004.

(51) Int. Cl.
*H03M 3/00* (2006.01)
*H03M 7/34* (2006.01)

(52) U.S. Cl. ........................................ 341/143; 341/51
(58) Field of Classification Search ................. 341/143, 341/51, 107, 65, 67; 375/240; 382/240
See application file for complete search history.

(56) References Cited

U.S. PATENT DOCUMENTS 4,622,680 A * 11/1986 Zinser ........................ 375/245

(Continued)

FOREIGN PATENT DOCUMENTS

EP 0 940 994 9/1999

(Continued)

OTHER PUBLICATIONS

European Search Report for appl. No. 05800872.3-2223/1797642, mailed Oct. 21, 2008, 8 pgs.

(Continued)

*Primary Examiner*—Peguy JeanPierre
(74) *Attorney, Agent, or Firm*—Squire, Sanders & Dempsey, L.L.P.

(57) ABSTRACT

A system, method and computer program product provide finer rate control in data compression by processing a data stream through a plurality of parallel subbands, wherein a first subband processes the data differently than a second subband. Separate shift quantization parameters for each separate run-of-zeros compressed storage area or pile can be provided, instead of a single common shift parameter for every coefficient as in the prior art. The parameter value for each such area or pile can be recorded in the compressed output file. The separate shift quantization parameters can also be adjusted dynamically as data is being compressed.

8 Claims, 3 Drawing Sheets

U.S. PATENT DOCUMENTS

| | | | | |
|---|---|---|---|---|
| 4,817,146 | A * | 3/1989 | Szczutkowski et al. | 380/261 |
| 5,276,525 | A * | 1/1994 | Gharavi | 382/245 |
| 5,983,172 | A * | 11/1999 | Takashima et al. | 704/203 |
| 6,215,908 | B1 * | 4/2001 | Pazmino et al. | 382/240 |
| 6,359,928 | B1 * | 3/2002 | Wang et al. | 375/240.05 |
| 6,567,562 | B1 | 5/2003 | Nakayama et al. | |
| 6,674,420 | B2 * | 1/2004 | Matsueda et al. | 345/87 |
| 6,691,082 | B1 * | 2/2004 | Aguilar et al. | 704/219 |
| 6,961,472 | B1 * | 11/2005 | Acharya et al. | 382/240 |
| 2002/0060657 | A1 * | 5/2002 | Matsueda et al. | 345/89 |
| 2003/0118242 | A1 | 6/2003 | Nakayama et al. | |
| 2005/0271289 | A1 * | 12/2005 | Rastogi | 382/240 |
| 2006/0034525 | A1 * | 2/2006 | Sakai | 382/232 |

FOREIGN PATENT DOCUMENTS

| | | |
|---|---|---|
| EP | 1 333 679 | 8/2003 |
| EP | 1 351 518 | 10/2003 |
| EP | 1 423 971 | 6/2004 |
| WO | WO 03/005626 | 1/2003 |
| WO | WO 03/009153 | 1/2003 |

OTHER PUBLICATIONS

Malvar et al., "Fast progressive wavelet coding", IEEE Computer Society press., pp. 336-343 (1999).

Schaar Van Der et al., "Near-Lossless Complexity-Scalable Embedded Compression Algorithm for cost Reduction in DTV Receivers", IEEE pp. 923-933 (2000).

Teuhola "A Compression Method for Clustred BIT-Vectors", Info. Process. Letters vol. 7, No. 6, pp. 308-311 (1978).

* cited by examiner

COMPRESSION RATE CONTROL SYSTEM AND METHOD WITH VARIABLE SUBBAND PROCESSING

RELATED APPLICATIONS

The present application claims priority from provisional applications filed Sep. 21, 2004 under U.S. Patent Application No. 60/612,311 entitled RATE CONTROL WITH VARIABLE SUBBAND QUANTIZATION; filed Sep. 22, 2004 under U.S. Patent Application No. 60/612,652 entitled SPLIT TABLE ENTROPY CODING; filed Sep. 22, 2004 under U.S. Patent Application No. 60/612,651 entitled PERMUTATION PROCRASTINATION; filed Oct. 12, 2004 under U.S. Patent Application No. 60/618,558 entitled MOBILE IMAGING APPLICATION, DEVICE ARCHITECTURE, AND SERVICE PLATFORM ARCHITECTURE; filed Oct. 13, 2004 under U.S. Patent Application No. 60/618,938 entitled VIDEO MONITORING APPLICATION, DEVICE ARCHITECTURES, AND SYSTEM ARCHITECTURE; filed Feb. 16, 2005 under U.S. Patent Application No. 60/654,058 entitled MOBILE IMAGING APPLICATION, DEVICE ARCHITECTURE, AND SERVICE PLATFORM ARCHITECTURE AND SERVICES; each of which is incorporated herein by reference in its entirety.

The present application is a continuation-in-part of U.S. patent application Ser. No. 10/944,437 filed Sep. 16, 2004 entitled MULTIPLE CODEC-IMAGER SYSTEM AND METHOD, now U.S. Publication No. US2005/0104752 published on May 19, 2005; continuation-in-part of U.S. patent application Ser. No. 10/418,649 filed Apr. 17, 2003 entitled SYSTEM, METHOD AND COMPUTER PROGRAM PRODUCT FOR IMAGE AND VIDEO TRANSCODING, now U.S. Publication No. US2003/0206597 published on Nov. 6, 2003; continuation-in-part of U.S. patent application Ser. No. 10/418,363 filed Apr. 17, 2003 entitled WAVELET TRANSFORM SYSTEM, METHOD AND COMPUTER PROGRAM PRODUCT, now U.S. Publication No. US2003/0198395 published on Oct. 23, 2003; continuation-in-part of U.S. patent application Ser. No. 10/447,455 filed on May 28, 2003 entitled PILE-PROCESSING SYSTEM AND METHOD FOR PARALLEL PROCESSORS, now U.S. Publication No. US2003/0229773 published on Dec. 11, 2003; continuation-in-part of U.S. patent application Ser. No. 10/447,514 filed on May 28, 2003 entitled CHROMA TEMPORAL RATE REDUCTION AND HIGH-QUALITY PAUSE SYSTEM AND METHOD, now U.S. Publication No. US2003/0235340 published on Dec. 25, 2003; continuation-in-part of U.S. patent application Ser. No. 10/955,240 filed Sep. 29, 2004 entitled SYSTEM AND METHOD FOR TEMPORAL OUT-OF-ORDER COMPRESSION AND MULTI-SOURCE COMPRESSION RATE CONTROL, now U.S. Publication No. US2005/0105609 published on May 19, 2005 each of which is incorporated herein by reference in its entirety. This application also incorporates by reference in its entirety U.S. Pat. No. 6,825,780 issued on Nov. 30, 2004 entitled MULTIPLE CODEC-IMAGER SYSTEM AND METHOD; and U.S. Pat. No. 6,847,317 issued on Jan. 25, 2005 entitled SYSTEM AND METHOD FOR A DYADIC-MONOTONIC (DM) CODEC.

FIELD OF THE INVENTION

The present invention relates to data compression, and more particularly to controlling compression output bit rates.

BACKGROUND OF THE INVENTION

Directly digitized still images and video requires many "bits". Accordingly, it is common to compress images and video for storage, transmission, and other uses. Most image and video compressors share a basic architecture, with variations. The basic architecture has three stages: a transform stage, a quantization stage, and an entropy coding stage, as shown in FIG. 1.

Video "codecs" (compressor/decompressor) are used to reduce the data rate required for data communication streams by balancing between image quality, processor requirements (i.e. cost/power consumption), and compression ratio (i.e. resulting data rate). The currently available compression approaches offer a different range of trade-offs, and spawn a plurality of codec profiles, where each profile is optimized to meet the needs of a particular application.

The intent of the transform stage in a video compressor is to gather the energy or information of the source picture into as compact a form as possible by taking advantage of local similarities and patterns in the picture or sequence. Compressors are designed to work well on "typical" inputs and ignore their failure to compress "random" or "pathological" inputs.

Many image compression and video compression methods, such as MPEG-2, use the discrete cosine transform (DCT) as the transform stage.

Some newer image compression and video compression methods, such as MPEG-4 textures, use various wavelet transforms as the transform stage.

A wavelet transform comprises the repeated application of wavelet filter pairs to a set of data, either in one dimension or in more than one. For image compression, a 2 D wavelet transform (horizontal and vertical) can be used. For video data streams, a 3 D wavelet transform (horizontal, vertical, and temporal) can be used.

Prior Art FIG. 2 shows an example 100 of trade-offs among the various compression algorithms currently available. As shown, such compression algorithms include wavelet-based codecs 102, and DCT-based codecs 104 that include the various MPEG video distribution profiles.

2D and 3D wavelets, as opposed to DCT-based codec algorithms, have been highly regarded due to their pleasing image quality and flexible compression ratios, prompting the JPEG committee to adopt a wavelet algorithm for its JPEG2000 still image standard. Unfortunately, most wavelet implementations use very complex algorithms, requiring a great deal of processing power, relative to DCT alternatives. In addition, wavelets present unique challenges for temporal compression, making 3D wavelets particularly difficult.

For these reasons, wavelets have never offered a cost-competitive advantage over high volume industry standard codecs like MPEG, and have therefore only been adopted for niche applications. There is thus a need for a commercially viable implementation of 3D wavelets that is optimized for low power and low cost focusing on three major market segments.

For example, small video cameras are becoming more widespread, and the advantages of handling their signals digitally are obvious. For instance, the fastest-growing segment of the cellular phone market in some countries is for phones with image and video-clip capability. Most digital still cameras have a video-clip feature. In the mobile wireless handset market, transmission of these still pictures and short video clips demand even more capacity from the device battery. Existing video coding standards and digital signal processors put even more strain on the battery.

Another new application is the Personal Video Recorders (PVR) that allow a viewer to pause live TV and time-shift programming. These devices use digital hard disk storage to record the video, and require video compression of analog video from a cable. In order to offer such features as picturein-picture and watch-while-record, these units require multiple video compression encoders.

Another growing application area is the Digital Video Recorders (DVR) for surveillance and security video. Again, compression encoding is required for each channel of input video to be stored. In order to take advantage of convenient, flexible digital network transmission architectures, the video often is digitized at the camera. Even with the older multiplexing recorder architecture, multiple channel compression encoders are used.

Of course, there are a vast number of other markets which would benefit from a commercially viable compression scheme that is optimized for low power and low cost.

Temporal Compression

Video compression methods normally do more than compress each image of the video sequence separately. Images in a video sequence are often similar to the other images in the sequence nearby in time. Compression can be improved by taking this similarity into account. Doing so is called "temporal compression". One conventional method of temporal compression, used in MPEG, is motion search. In this method, each region of an image being compressed is used as a pattern to search a range in a previous image. The closest match is chosen, and the region is represented by compressing only its difference from that match.

Another method of temporal compression is to use wavelets, just as in the spatial (horizontal and vertical) directions, but now operating on corresponding pixels or coefficients of two or more images. This is called 3D wavelets, for the three "directions" horizontal, vertical, and temporal.

Temporal compression, by either method or any other, compresses an image and a previous image together. In general, a number of images is compressed together temporally. As embodied on the present invention, this set of images is called a Group of Pictures or GOP.

Subbands

The output of a wavelet transform contains coefficients that represent "lowpass" or "scale" or "sum" information, that is generally common information over several pixels. The output also contains coefficients that represent "highpass" or "wavelet" or "difference" information, that generally represents how the pixels differ from their common information. The repeated application of wavelet filters results in numerous different combinations of these types of information in the output. Each distinct combination is referred to as a "subband". The terminology arises from a frequency-domain point of view, but in general does not exactly correspond to a frequency band.

The wavelet transform produces very different value distributions in the different subbands of its output. The information that was spread across the original pixels is concentrated into some of the subbands leaving others mostly zero. This is desirable for compression.

Run-of-Zeros Compression

An intermediate step in some image and video compression algorithms is run-of-zeros elimination, which can be implemented by "piling" (see co-pending U.S. Patent Application 2003/0229773). In the run-of-zeros step, the coefficients of a subband (or a group of subbands) are compressed, crudely but very efficiently. The run-of-zeros step removes runs of zero values from the data, while preserving a record of where these zero values occurred. Run-of-zeros elimination can be applied at any point in the algorithm. In one embodiment, it is applied just following the quantization stage, before entropy coding. After run-of-zeros, the succeeding steps can be computed much faster because they only need to operate on significant (non-zero) information.

Piling has great value on computing engines that process multiple values in parallel, as it is a way to do zero-elimination that takes advantage of the available parallelism. In contrast, other methods run-of-zeros elimination (run-length coding) typically take as much time as it would take to eliminate the zeros during the entropy encoding.

Storage Area Per Subband

In some compression implementations according to the present invention, it is advantageous to construct a separate pile or run-of-zeros compressed storage area for each subband, or for a group of similar subbands, or in some cases multiple areas for a single subband. An advantage arises out of the sequence in which the subband results become available and other details of the algorithm. Thus instead of a single storage area as an intermediate representation for a picture or GOP, there is a set of storage areas or piles.

Rate Control

One method of adjusting the amount of compression, the rate of output bits produced, is to change the amount of information discarded in the quantization stage of the computation. Quantization is conventionally done by dividing each coefficient by a pre-chosen number, the "quantization parameter", and discarding the remainder of the division. Thus a range of coefficient values comes to be represented by the same single value, the quotient of the division.

When the compressed image or GOP is decompressed, the inverse quantization process step multiplies the quotient by the (known) quantization parameter. This restores the coefficients to their original magnitude range for further computation.

However, division (or equivalently multiplication) is an expensive operation in many implementations, in terms of power and time consumed, and in hardware cost. Note that the quantization operation is applied to every coefficient, and that there are usually as many coefficients as input pixels.

In another method, instead of division (or multiplication), quantization is limited to divisors that are powers of 2. This has the advantage that it can be implemented by a bit-shift operation on binary numbers. Shifting is very much less expensive operation in many implementations. An example is integrated circuit (FPGA or ASIC) implementation; a multiplier circuit is very large, but a shifter circuit is much smaller. Also, on many computers, multiplication requires longer time to complete, or offers less parallelism in execution, compared to shifting.

While quantization by shifting is very efficient with computation, it has a disadvantage for some purposes: it only allows coarse adjustment of the compression rate (output bit rate). According to aspects of the present invention, It is observed in practice that changing the quantization shift parameter by the smallest possible amount, +1 or −1, results in nearly a 2-fold change in the resulting bit rate. For some applications of compression, this is quite acceptable. For other applications, finer rate control is required.

Therefore, there is a need to meet the requirement of finer rate control without abandoning quantization by shifting, and its associated efficiency.

SUMMARY

A system, method and computer program product according to aspects of the present invention are disclosed for providing finer rate control in a data compression system. The data stream is quantized through a plurality of parallel subbands, wherein the data of a first subband is processed differently than the data of a second subband. Additionally, according to aspects of the present invention, each individual subband of the image can be processed in a distinct fashion in the quantization step. Additionally, groups of individual subbands can be processed in identical or similar fashion while a second group of subbands relating to the same image can be processed in a second identical or similar fashion. Additionally, in other aspects of the present invention, each individual subband can be processed in a unique fashion during the quantization step.

According to additional aspects of the present invention, a distinct, identical or similar processing of subband data can be carried out in either the transform, quantization or entropy coding steps or in each of the transform, quantization and entropy coding steps. Additionally, unique processing of all of the subband data can be carried out in each of the transform, quantization and entropy coding steps with the result being that the data of a first subband is processed in a first fashion during the quantization step and the data of a second subband is processed in a second fashion during the quantization step while yet further the resulting data of the first subband is processed in a third fashion during the entropy coding step while the resulting data of the second subband is processed in a fourth fashion during the entropy coding step. It can be seen then that individual subbands may be processed in a variety of fashions in the transform, quantization and entropy coding steps. Additionally groups of subbands may be also processed in identical or similar fashion while other groups of subbands may be processed in a second identical or a second similar fashion.

In one embodiment of the present invention, a separate shift quantization parameter for each separate run-of-zeros compressed storage area or pile is provided, instead of providing a single common shift parameter for every coefficient as in the prior art. The parameter value for each such area or pile can be recorded in the compressed output file. This overcomes the coarseness problem found in the prior art without giving up the efficiency of shift quantization.

The invention allows a range of effective bit rates in between the nearest two rates resulting from quantization parameters applied uniformly to all coefficients, providing finer control of the compression. Moreover, the computational efficiency provided is almost exactly that of pure shift quantization, since typically the operation applied to each coefficient is still a shift.

According to another aspect of the invention, separate shift quantization parameters are adjusted dynamically as data is being compressed. Such adjustments can result from feedback or feedforward measurements taken from the data stream anywhere along the compression process. Alternatively, adjustments can result from changes in the parameters of the input or output data. For example, source image quality or output bandwidth availability (such as varying cellular phone signal strength) can drive fine adjustments to a compression process by individually changing separate shift quantization parameters "on the fly".

DESCRIPTION OF THE PREFERRED EMBODIMENTS

Figure 1:
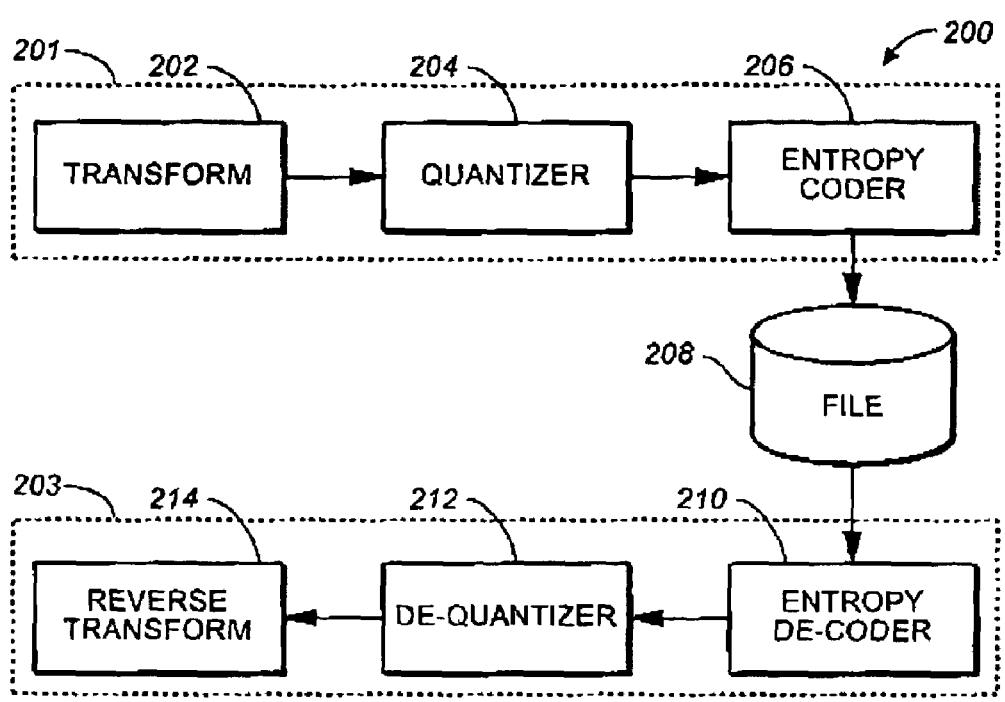
FIG. 1 illustrates a framework for compressing/decompressing data, in accordance with one embodiment.
Figure 2:
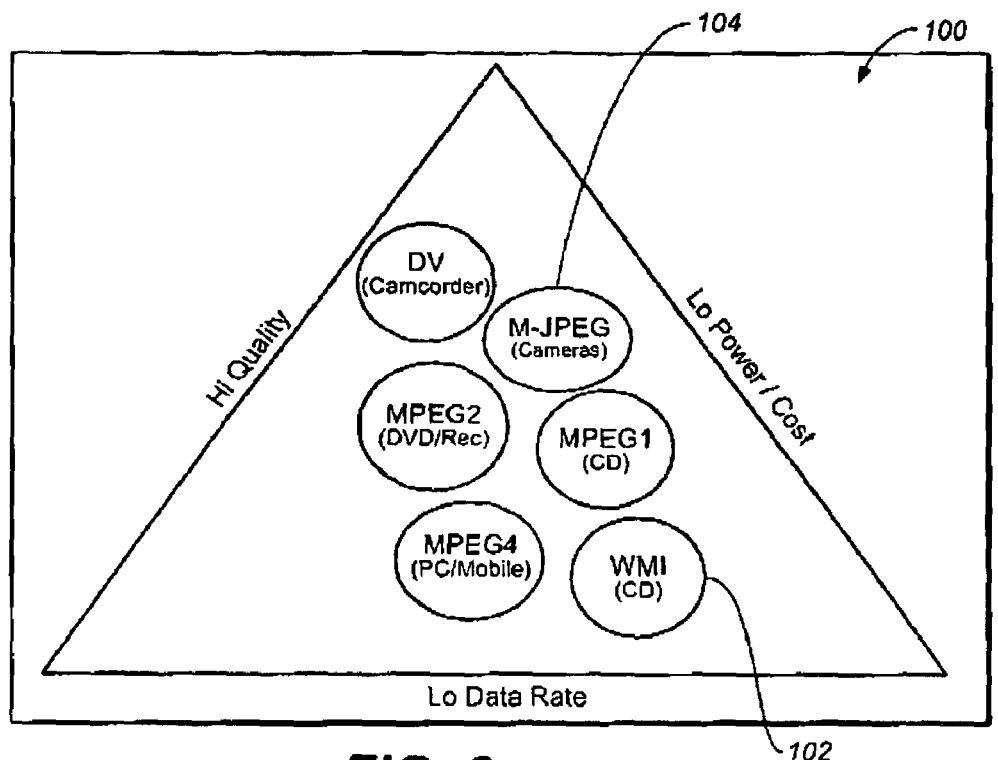
FIG. 2 shows an example of trade-offs among the various compression algorithms currently available.
Figure 3:
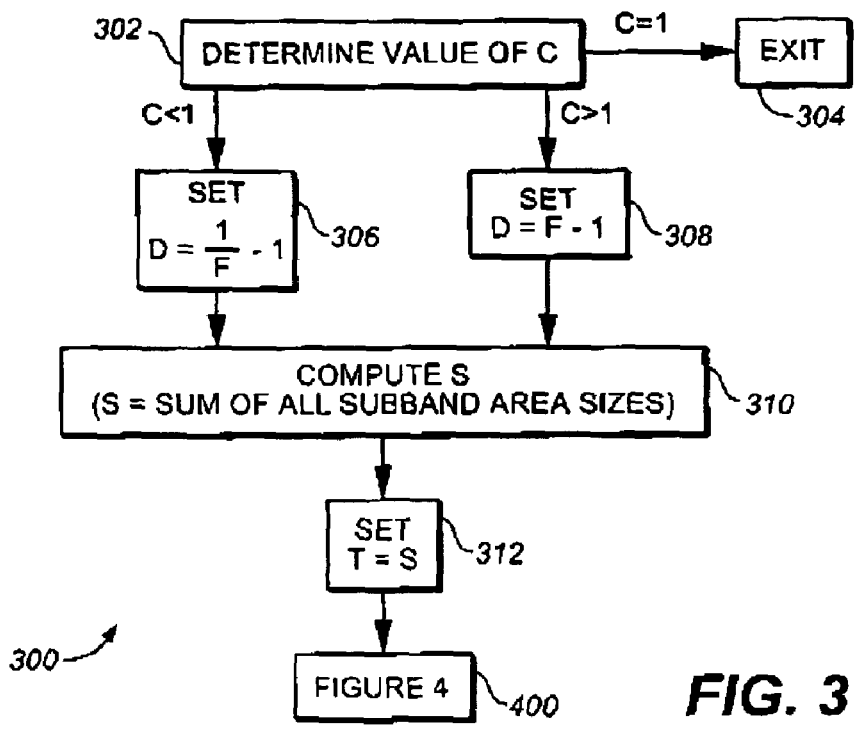
FIGS. 3 and 4 illustrate, respectively, a first and second step associated with an algorithm for adjusting quantization parameters.
Figure 4:
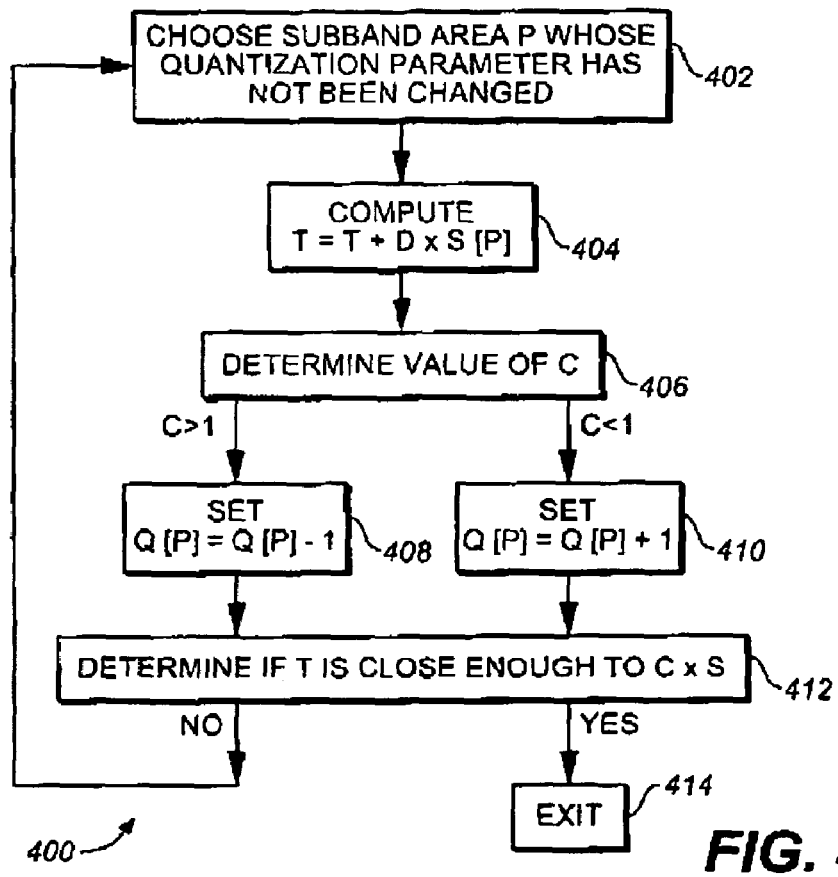

FIG. 1 illustrates a framework 200 for compressing/decompressing data, in accordance with one embodiment. Included in this framework 200 are a coder portion 201 and a decoder portion 203, which together form a "codec." The coder portion 201 includes a transform module 202, a quantizer 204, and an entropy encoder 206 for compressing data for storage in a file 208. To carry out decompression of such file 208, the decoder portion 203 includes an entropy decoder 210, a de-quantizer 212, and a reverse transform module 214 for decompressing data for use (i.e. viewing in the case of video data, etc).

In use, the transform module 202 carries out a reversible transform, often linear, of a plurality of pixels (in the case of video data) for the purpose of de-correlation. Next, the quantizer 204 effects the quantization of the transform values, after which the entropy encoder 206 is responsible for entropy coding of the quantized transform coefficients.

In order to overcome the coarseness problem of the prior art described above without giving up the efficiency of shift quantization, the quantization is generalized. Instead of using, as before, a single common shift parameter for every coefficient, we provide for a distinct shift parameter to be applied to each separate run-of-zeros compressed storage area or pile. The parameter value for each such area or pile is recorded in the compressed output file. A pile is a data storage structure in which data are represented with sequences of zeros (or of other common values) compressed. It should be noted that a subband may comprise several separate piles or storage areas. Alternately, a pile or storage area may comprise several separate subbands.

This solution now allows a range of effective bit rates in between the nearest two rates resulting from quantization parameters applied uniformly to all coefficients. For example, consider a case in which all subbands but one (subband x) use the same quantization parameter, Q, and that one (subband x) uses Q+1. The resulting overall bit rate from the quantization step is reduced as compared to using Q for all subbands in the quantization, but not to the degree as if Q+1 were used for all subbands. This provides an intermediate bit rate between that achieved by uniform application of Q or Q+1, giving a better, finer control of the compression.

Note that the computational efficiency is almost exactly that of pure shift quantization, since typically the operation applied to each coefficient is still a shift. Any number of subbands can be used. Four to one-hundred subbands are typical. Thirty-two is most typical.

Choosing the Parameters

In the above method, it might be presumed that with P subband areas, increasing the quantization parameter in one area subband would affect the output rate by a factor of 1/P, as compared to increasing the quantization parameter for all subbands. This is usually not so, however, because the separate subband areas usually contain very different amounts of significant information. Accordingly, applying a specific quantization parameter to a subband having a relatively large amount of significant coefficients (compared to other subbands) will have a larger impact on the net effective bit rate of quantization than would applying the same quantization parameter to a separate subband that has a relatively small amount of significant coefficients in it compared to the other subbands.

It should be noted that in various embodiments of the present invention, it is not only the parameter applied in the entropy coding step that can be changed, but the actual choice of entropy coding technique applied to separate storage areas can be changed. For example, a Huffman table technique can be applied for entropy coding of one storage area while a separate Huffman table can be applied to a second storage area. Moreover, a separate technique such as exponential Golomb coding can be applied to the second or a third storage area. In like manner additional techniques or parameters of techniques can be separately applied to separate storage areas. Further, each of the above variations can be applied dynamically.

It should also be noted that in certain embodiments indicia corresponding to the state of parameters or techniques applied in processing a particular storage area are recorded or otherwise conveyed to the decoder to enable decoding of the compressed signal. In some embodiments the state of the parameters or techniques used in compression can be discerned from the structure of the compressed data being decoded. As additional aspects of the present invention the decoder can be programmed with the same logic corresponding to the logic of the encoder so that the decoder can track the state of the encoder.

Therefore in order to choose a set of quantization parameters that best approximate a desired compression rate, one can take account of the expected size of the areas whose quantization are being adjusted, as well as of the expected effect of the adjustment on a subband area. This can be done with a simple iterative process, such as the example process outlined below.

EXAMPLE 1 FOR ADJUSTING QUANTIZATION PARAMETERS

The example algorithm begins with a set of quantization parameters given by initialization or carried over from the previous image or GOP. Call these Q[P] for each run-of-zeros compressed area P. We also have a desired change in compression output rate, expressed as a factor C. This description assumes that changing a Q value by 1 results in a factor of F change in output rate from the part of the compression using that Q value. We assume that C<F and 1/F<1/C. The areas have sizes S[P]; for purposes of this algorithm, the sizes may be estimates rather than measured sizes.

Step 1.
If C=1, do nothing and exit the adjustment process.
If C>1, set D=F−1.
If C<1, set D=(1/F)−1.
Compute S as the sum of all subband area sizes.
Set T=S.
Step 2.
Choose a subband area P whose quantization parameter has not been changed yet.
Compute T=T+D*S[P].
If C>1, set Q[P]=Q[P]−1.
If C<1, set Q[P]=Q[P]+1.
Step 3.
If T is close enough to C*S, exit the adjustment process.
Go to Step 2.

Various refinements of the above example may be implemented, for instance as in the following example.

EXAMPLE 2

In step 3 of the algorithm above, the test "close enough" may be implemented in any of several ways. One simple version of this test is the following:
Test 3.
If (C>1 and T>C*S) or (C<1 and T<C*S) . . .
This test stops the iteration as soon as the estimated rate adjustment exceeds the adjustment specified.

An additional alternative embodiment is to revert to the step just prior to the step that caused the estimated rate to exceed the adjustment specified. Another alternative is to choose between the two steps that bracket the specified adjustment C, for instance by choosing the one resulting in a nearer estimate to the specified rate.

Advantages

The process of example 1 algorithm given above has the property that the quantization changes are kept within one step of each other: a Q value is changed either by one, or not at all, and the changes are all in the same direction. The process can be easily extended, by retaining information about the choices of P in step 2, to maintain that property over many executions of the algorithm (that is, over many successive image or GOP compression operations). This is often desirable because the adjustment of quantization has an effect not only on compression output rate, but on picture quality as well (that is, on the noise or artifacts in decompressed images or video due to the compression process).

However it should be noted that this property, keeping the Q values within one step of equality, is not necessary and can sometimes be relaxed in favor of other considerations.

Varying of the process parameters by subband can include using multiplication or division or other quantizing techniques instead of applying shift parameters as described above.

The subbands can be put in order of importance, such as "low-pass" first and "high-pass" subsequent, so that when Q values are chosen, the lesser important subbands are downgraded first. In this way, when a higher overall compression rate is selected at the cost of image quality, subbands representing the basic properties of the image will not downgraded before subbands representing only very fine details of the image. A lookup table can also be utilized to select various subbands for downgrading based on characteristics of the image. For example, to increase overall compression rate of a particular image, subbands may be downgraded in a particular order if the image is of a particular type, such as "outdoor live action". If the image is of a different type, such as "low-level lighting", "portrait video", "still image", "scenery", etc., the lookup table will provide a different order and/or magnitudes for changing the Q value of each subband.

Alternate Embodiments

Changes to subband quantization parameters as described above can be fixed, predetermined for a particular data stream, or adjusted dynamically as the data is being compressed. For an example of dynamic adjustment, output data can be sampled at the end of the compression process 201 shown in FIG. 1 (i.e. after entropy coder 206.) If the bit rate measured is too high, this information can be fed back to an algorithm that changes the shift parameter of one or more subbands to bring the bit rate down to a desired level or range. If the measured bit rate is lower than the desired level or range, the shift parameter of one or more subbands can be changed in an opposite direction to increase the bit rate. This creates a lower compression ratio, thereby increasing image quality. One advantage to this arrangement is that the images are compressed just enough to be transmitted across a fixed bandwidth system, such as a cellular phone line, but retain as much image quality as possible.

Data need not be measured or sampled only at the output of compression process 201. For example, it can be measured at the input to process 201. Different images or portions of images may produce higher bit rates as they are fed into compression process 201. For instance, this can occur when the source image quality or size is increased. This can also occur in video surveillance systems where the outputs of multiple cameras are multiplexed into a single data stream for compression. If the number of cameras being used is increased, the source data rate will increase. In such a feedforward arrangement, it may be desirable to change the shift parameter of one or more subbands downstream in quantizer 204 in response to the variations measured in the source. One advantage to using this feedforward arrangement is that it may be possible to change the shift parameters before the measured source data reaches quantizer 204, or at least sooner than the parameters could be changed by the previously described feedback arrangement. Another advantage is that actual processing steps may be eliminated downstream based on the feedforward measurement. This can increase overall processing time and/or reduce power consumption.

As described above, dynamic systems can be utilized where the data is measured before or after compression process 201. Similar dynamic systems can be implemented where the data is measured at one or more points within compression process 201. For instance, data used to affect the shift parameters could be measured or sampled within transform stage 202, between transform stage 202 and quantizer stage 204, within quantizer stage 204, between quantizer stage 204 and entropy coder stage 206, and/or within entropy coder stage 206. The earlier in the process that the data is measured, the faster the changes can be made based on that data. The later in the process that the data is measured, the more accurate a desired output rate is likely to be. Similarly, data can be measured or sampled at various points throughout a compression process that does not have a typical transform 202, quantizer 204 and entropy coder 206 architecture.

Shift parameters can be dynamically changed according to the present invention even without taking measurements or samples of the data somewhere in compression process 201. For instance, changes in other parameters may make it desirable to make dynamic changes to compression process 201. By way of example, compressed data may be stored in one or more files 208. When the size of a current file changes or there is an indication that the data in the file is nearing capacity, it is desirable to increase the compression ratio, thereby reducing the output bit rate to conserve file space. By way of another example, compressed data may be transmitted over a cellular phone network. As signal strength increases or decreases, it may be desirable to dynamically change properties of the compression process in response.

Since the process adjustments described above are made dynamically, certain images in a group of images, or certain portions of one image may be compressed differently than other images or portions. This can lead to very efficient use of resources. However, it may also produce undesirable effects, such as noticeable differences in similar and/or adjacent portions of an image due to the portions being compressed differently. Such effects can be ameliorated by keeping the difference to one across all shift parameters. Alternatively or in conjunction, a spiral scan rather than a raster scan can also be used. Since the most important data in many images lies toward the center, details of the center portions can be kept in finer detail by using lower compression rates in these portions. As another alternative, sampling can be done at the center, a horizon, corners, etc. of an image.

It is to be understood that the transform stage 202 and the entropy coder stage 206 may also process the data stream with parallel subbands in a manner similar to that described in the examples above for the quantizer stage 204. Similarly, each subband in these stages may use a different coding technique. Parameters affecting the processing of each subband may be statically or dynamically adjusted in each of the separate subbands and in each of the separate stages 202, 204 and 206.

While the above is a complete description of the preferred embodiments of the invention, various alternatives, modifications, and equivalents may be used. Therefore, the above description should not be taken as limiting the scope of the invention which is defined by the appended claims.

What is claimed is:

1. A method of compressing data, comprising: processing a data stream through a plurality of parallel subbands, wherein a first subband processes the data differently than a second subband, and wherein the processing comprises quantizing wherein the first and second subbands each quantize the data by applying a shift parameter, and wherein the shift parameter of the first subband is different than the shift parameter of the second subband.

2. The method of claim 1, wherein the first subband is a low-pass subband and the second subband is a high-pass subband.

3. A method of compressing data, comprising: processing a data stream through a plurality of parallel subbands, wherein a first subband processes the data differently than a second subband, and wherein the processing comprises quantizing, further comprising a third subband that processes the data differently than either the first or the second subbands, wherein the first, second and third subbands each quantize the data by applying a shift parameter, and wherein the shift parameter of each of the first, second and third subbands is distinct.

4. A method of compressing data, comprising: processing a data stream through a plurality of parallel subbands, wherein a first subband processes the data differently than a second subband, and wherein the processing comprises quantizing, wherein of the plurality of subbands each quantize the data by applying either a first shift parameter or a different second shift parameter.

5. A method of compressing data, comprising: processing a data stream through a plurality of parallel subbands, wherein a first subband processes the data differently than a second subband, and wherein the processing comprises quantizing, wherein of the plurality of subbands each quantize the data by applying either a first shift parameter or a different second shift parameter, wherein the first shift parameter differs from the second shift parameter by 1.

6. A method of compressing data, comprising: processing a data stream through a plurality of parallel subbands, wherein a first subband processes the data differently than a second subband, and wherein the processing comprises quantizing, wherein the processing of at least one of the subbands is changed dynamically, wherein the processing of at least one of the subbands is changed in response to feedback from a downstream measurements, the downstream measurement to sample the at least one of the subbands after a compression process of the at least one subband.

7. A method of compressing data, comprising: processing a data stream through a plurality of parallel subbands, wherein a first subband processes the data differently than a second subband, and wherein the processing comprises quantizing, wherein the processing of at least one of the subbands is changed dynamically, wherein the processing of at least one of the subbands is changed in response to a feedforward signal from an upstream measurement, the upstream measurements to sample the at least one subbands before the compression process of the at least one of the subbands.

8. A method of compressing data, comprising: processing a data stream through a plurality of parallel subbands, wherein a first subband processes the data differently than a second subband, and wherein the processing comprises quantizing, wherein the processing step comprises entropy coding and wherein the first and second subbands each quantize the image data by applying a shift parameter, and wherein the shift parameter of the first subband is different than the shift parameter of the second subband.

* * * * *